(12) United States Patent
Noh et al.

(10) Patent No.: US 12,354,980 B2
(45) Date of Patent: Jul. 8, 2025

(54) SEMICONDUCTOR PACKAGE

(71) Applicant: SAMSUNG ELECTRONICS CO., LTD., Suwon-si (KR)

(72) Inventors: Boin Noh, Suwon-si (KR); Jeong Hoon Ahn, Seongnam-si (KR); Yun Ki Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 487 days.

(21) Appl. No.: 17/959,352

(22) Filed: Oct. 4, 2022

(65) Prior Publication Data
US 2023/0230944 A1 Jul. 20, 2023

(30) Foreign Application Priority Data
Jan. 19, 2022 (KR) .................. 10-2022-0007927

(51) Int. Cl.
*H01L 25/065* (2023.01)
*H01L 23/00* (2006.01)

(52) U.S. Cl.
CPC .............. *H01L 24/05* (2013.01); *H01L 24/08* (2013.01); *H01L 24/32* (2013.01); *H01L 24/73* (2013.01); *H01L 25/0657* (2013.01); *H01L 24/16* (2013.01); *H01L 2224/05009* (2013.01); *H01L 2224/05017* (2013.01); *H01L 2224/05018* (2013.01); *H01L 2224/05073* (2013.01); *H01L 2224/05082* (2013.01); *H01L 2224/05155* (2013.01); *H01L 2224/05166* (2013.01); *H01L 2224/05541* (2013.01);
(Continued)

(58) Field of Classification Search
CPC .................. H01L 24/05; H01L 24/08
See application file for complete search history.

(56) References Cited

U.S. PATENT DOCUMENTS

| 7,271,084 B2* | 9/2007 | Jeong ............... H01L 24/11 257/E23.068 |
| 7,332,423 B2* | 2/2008 | Starkston .............. H05K 3/303 257/E21.511 |

(Continued)

FOREIGN PATENT DOCUMENTS

| KR | 10-0196291 | 2/1999 |
| KR | 10-1185454 | 10/2012 |
| KR | 10-2014-0023625 | 2/2014 |

*Primary Examiner* — William A Harriston
(74) *Attorney, Agent, or Firm* — MORGAN, LEWIS & BOCKIUS LLP

(57) ABSTRACT

A semiconductor package includes a second semiconductor chip disposed on a first semiconductor chip. The first semiconductor chip includes a first semiconductor substrate, a through via, and a lower pad disposed on the through via. The lower pad includes a first segment and a second segment connected thereto. The first segment overlaps the through via. The second segment is disposed on an edge region of the first segment. The second segment has an annular shape. The second semiconductor chip includes a second semiconductor substrate, an upper pad disposed on a bottom surface of the second semiconductor substrate, and a connection terminal disposed between the upper and lower pads. The second segment at least partially surrounds a lateral surface of the upper pad. A level of a top surface of the second segment is higher than that of an uppermost portion of the connection terminal.

20 Claims, 15 Drawing Sheets

(52) U.S. Cl.
CPC ............... *H01L 2224/05554* (2013.01); *H01L 2224/05555* (2013.01); *H01L 2224/05557* (2013.01); *H01L 2224/05558* (2013.01); *H01L 2224/05573* (2013.01); *H01L 2224/05655* (2013.01); *H01L 2224/08148* (2013.01); *H01L 2224/16227* (2013.01); *H01L 2224/32145* (2013.01); *H01L 2224/32225* (2013.01); *H01L 2224/73204* (2013.01); *H01L 2224/73253* (2013.01); *H01L 2225/06517* (2013.01); *H01L 2225/06524* (2013.01); *H01L 2225/06527* (2013.01); *H01L 2225/06541* (2013.01); *H01L 2225/06565* (2013.01); *H01L 2924/1431* (2013.01); *H01L 2924/1434* (2013.01); *H01L 2924/3511* (2013.01)

(56) References Cited

U.S. PATENT DOCUMENTS

| | | | |
|---|---|---|---|
| 7,952,206 B2 * | 5/2011 | Bachman | H01L 24/05 257/737 |
| 8,299,616 B2 | 10/2012 | Chuang et al. | |
| 8,409,979 B2 * | 4/2013 | Choi | H01L 24/11 257/E23.021 |
| 8,456,856 B2 | 6/2013 | Lin et al. | |
| 9,978,710 B2 | 5/2018 | Dubey et al. | |
| 10,056,347 B2 * | 8/2018 | Chiu | C23C 18/32 |
| 2007/0069394 A1 * | 3/2007 | Bachman | H01L 24/05 257/E23.021 |
| 2008/0029888 A1 * | 2/2008 | Park | B23K 3/06 257/737 |
| 2008/0169559 A1 * | 7/2008 | Yang | H01L 24/11 257/E21.294 |
| 2009/0091036 A1 * | 4/2009 | Chen | H01L 24/05 257/770 |
| 2011/0186986 A1 * | 8/2011 | Chuang | H01L 24/05 257/737 |
| 2012/0306104 A1 * | 12/2012 | Choi | H01L 24/82 257/782 |
| 2013/0256871 A1 * | 10/2013 | Topacio | H01L 23/3171 257/E21.511 |
| 2014/0027900 A1 * | 1/2014 | Chiu | H01L 23/562 257/737 |
| 2017/0133346 A1 * | 5/2017 | Chiu | C23C 18/42 |

* cited by examiner

FIG. 4A
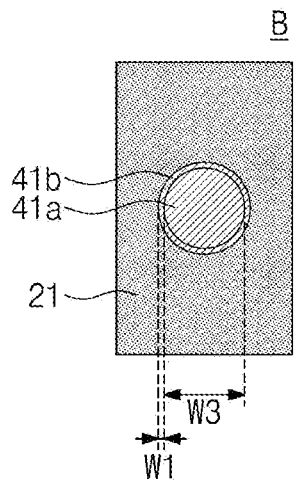
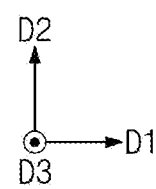
FIG. 4B
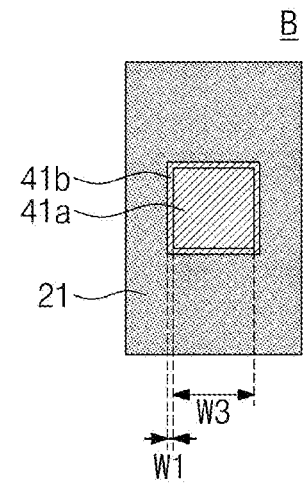
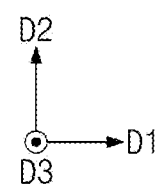
FIG. 5A
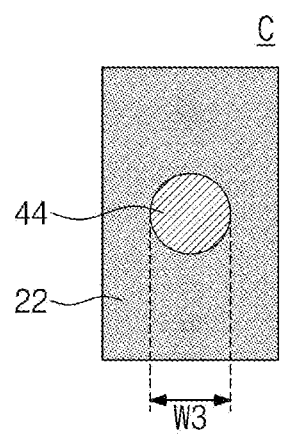
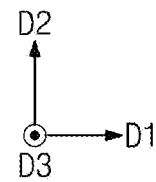
FIG. 5B
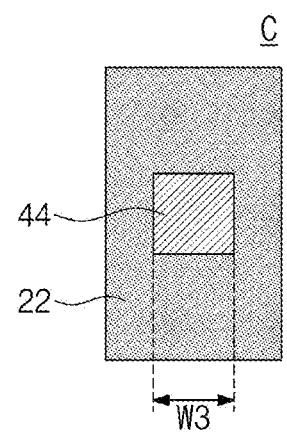
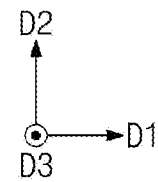

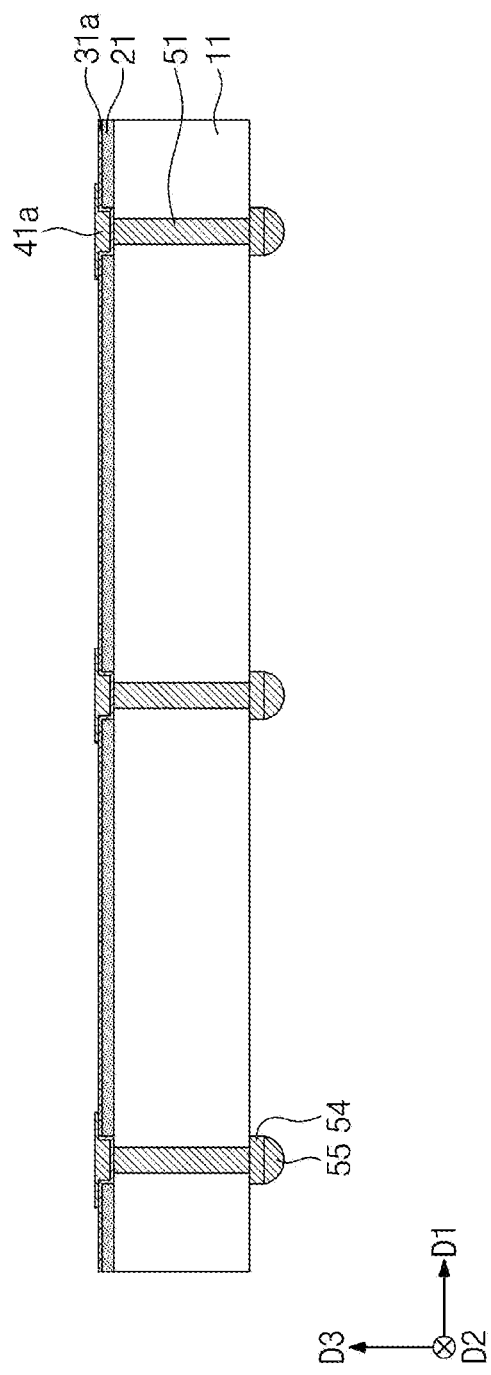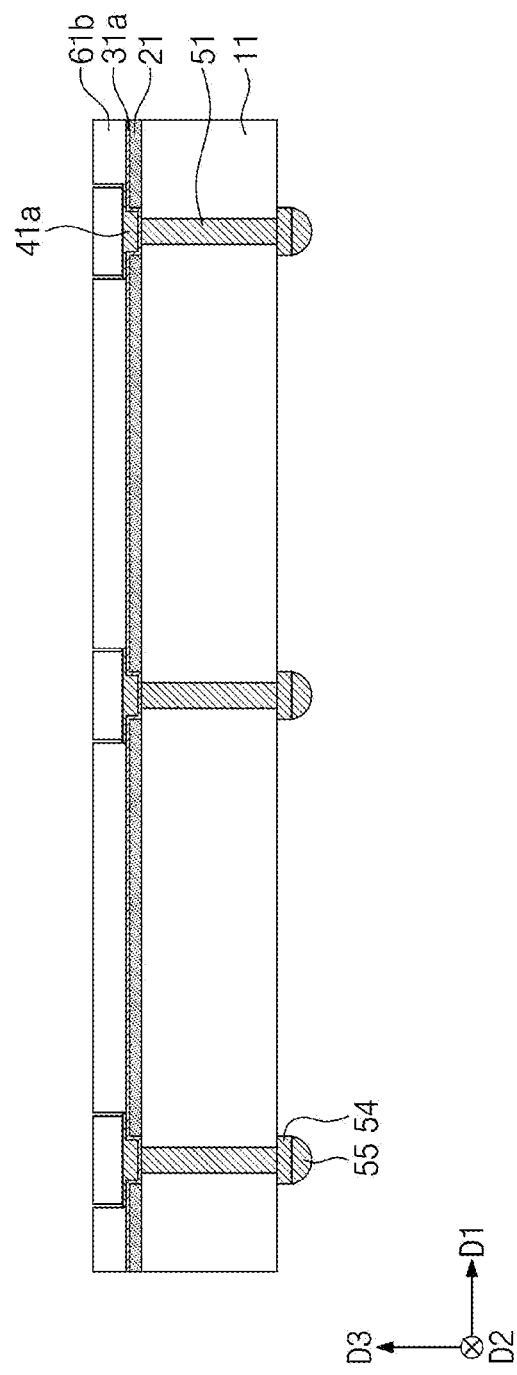

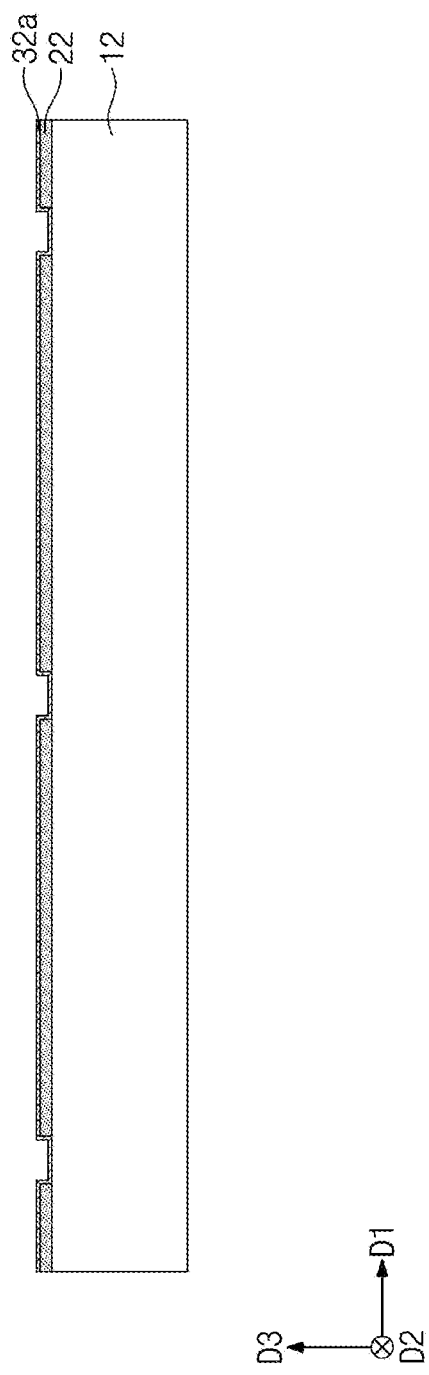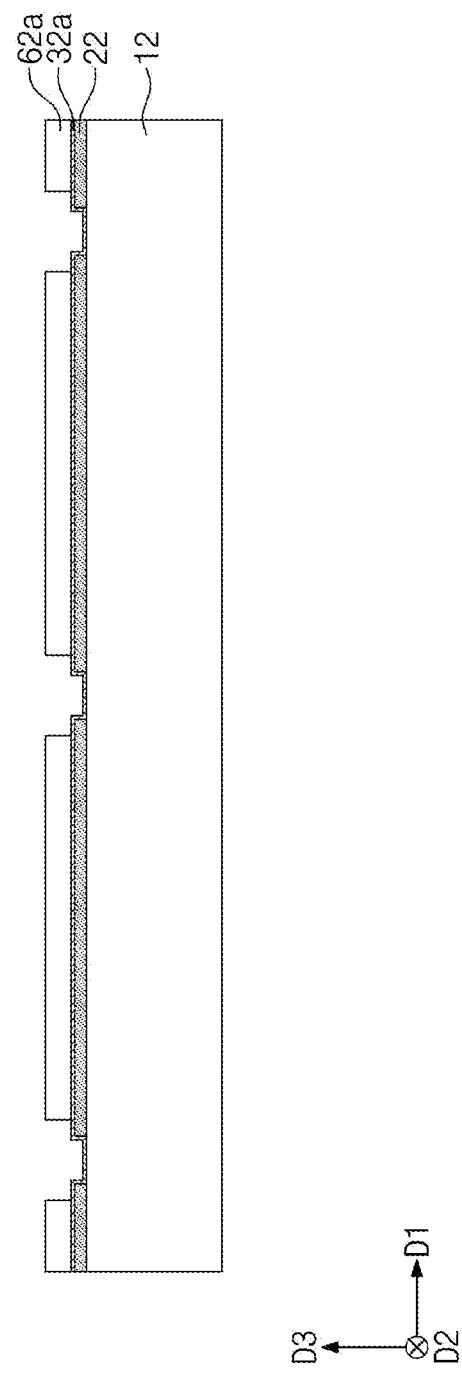

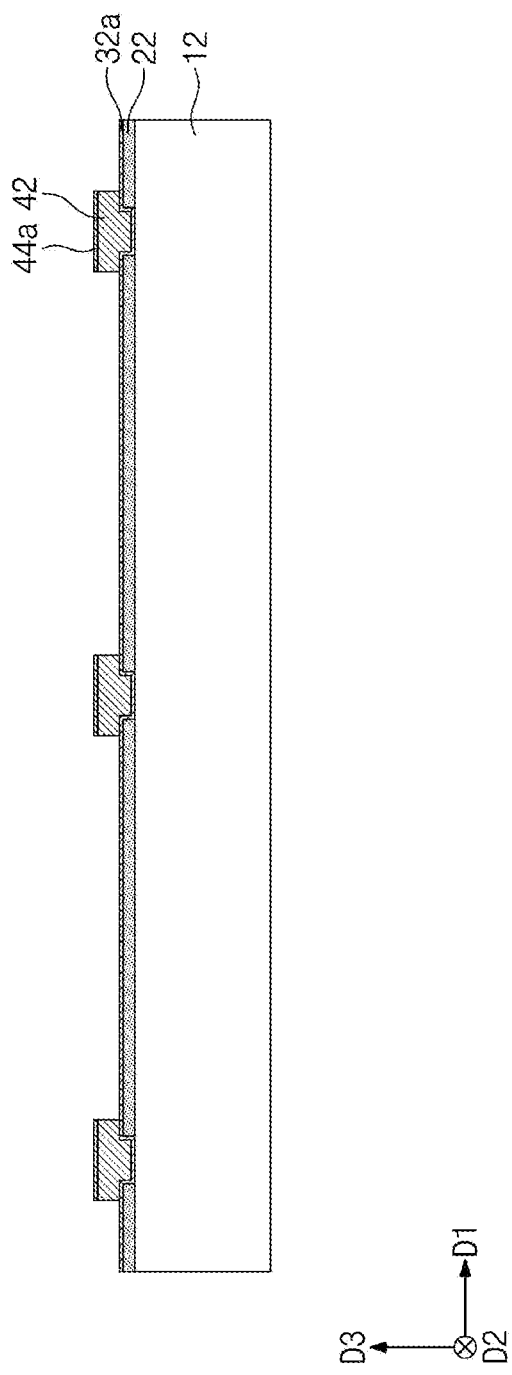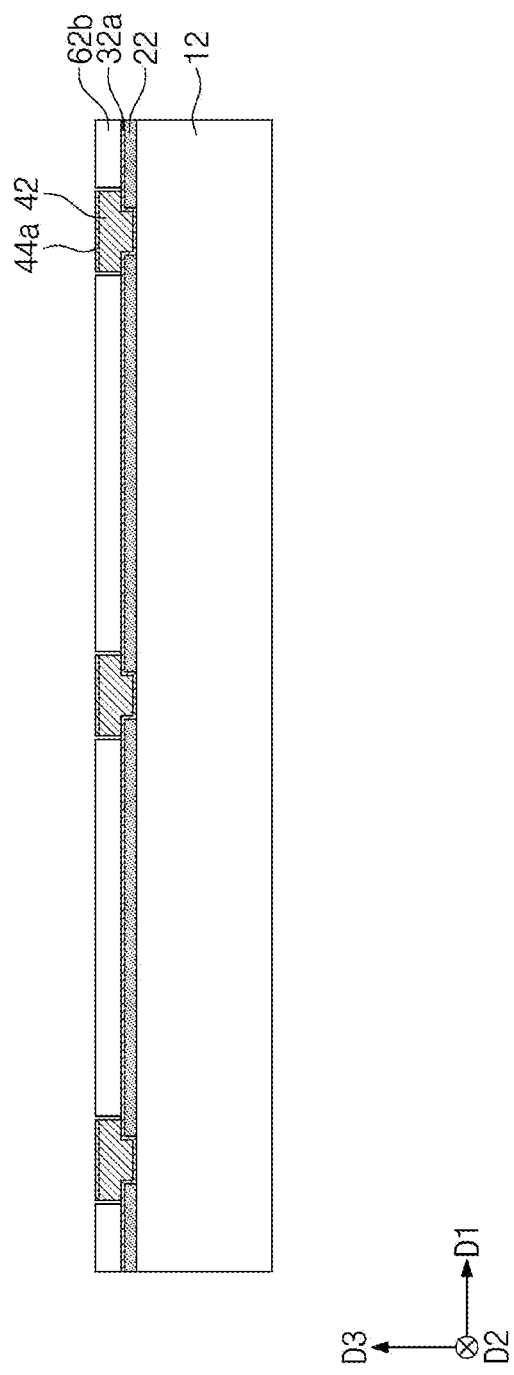

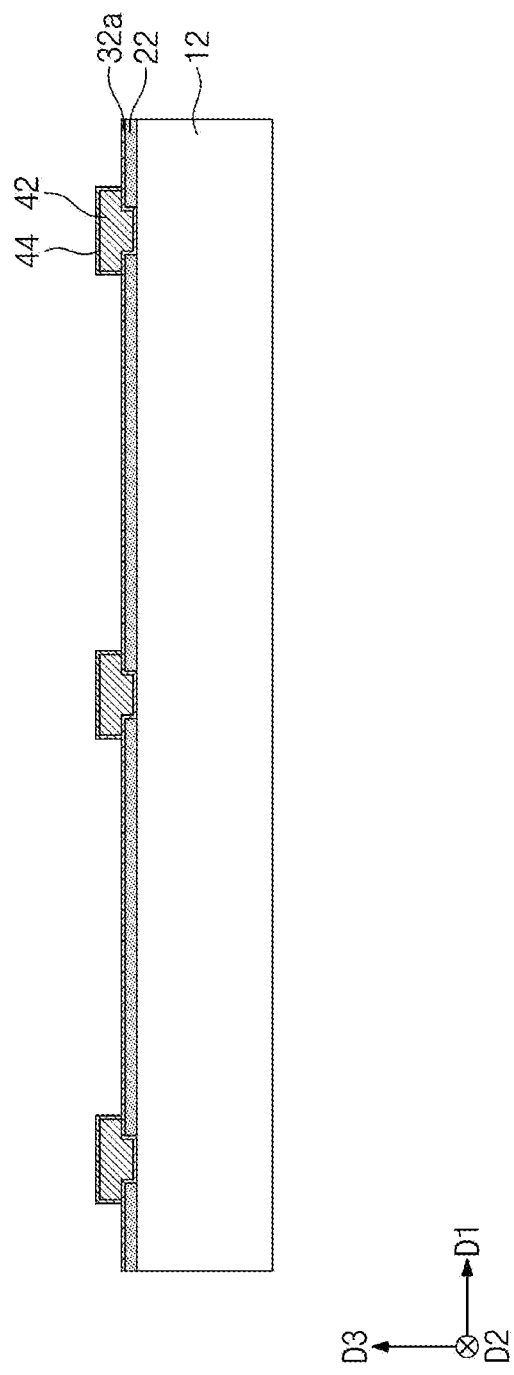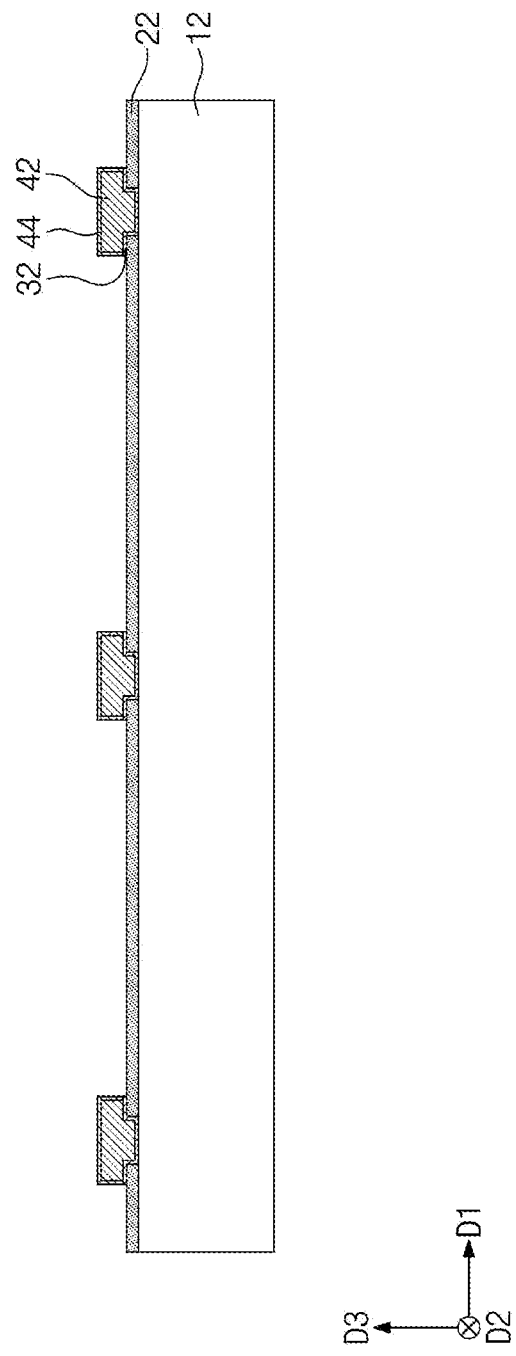

SEMICONDUCTOR PACKAGE

CROSS-REFERENCE TO RELATED APPLICATION

This U.S. nonprovisional application claims priority under 35 U.S.C. § 119 to Korean Patent Application No. 10-2022-0007927 filed on Jan. 19, 2022 in the Korean Intellectual Property Office, the disclosure of which is incorporated by reference herein in its entirety.

TECHNICAL FIELD

The present inventive concept relates to a semiconductor package.

DISCUSSION OF THE RELATED ART

A semiconductor package is provided to implement an integrated circuit chip for use in electronic products. A semiconductor package is typically configured such that a semiconductor die may be mounted on a printed circuit board (PCB), and bonding wires or bumps may be used to electrically connect the semiconductor die to the printed circuit board. As the electronic industry continues to develop, various studies have been conducted to increase reliability and durability of semiconductor packages.

SUMMARY

According to an embodiment of the present inventive concept, a semiconductor package includes: a first semiconductor chip; and a second semiconductor chip disposed on the first semiconductor chip, wherein the first semiconductor chip includes: a first semiconductor substrate; a through via that penetrates the first semiconductor substrate; and a lower pad disposed on the through via, wherein the lower pad includes: a first segment; and a second segment connected to the first segment, wherein the first segment of the lower pad vertically overlaps the through via, wherein the second segment of the lower pad is disposed on an edge region of the first segment, wherein the second segment has an annular shape, wherein the second semiconductor chip includes: a second semiconductor substrate; an upper pad disposed on a bottom surface of the second semiconductor substrate; and a connection terminal disposed between the upper pad and the lower pad, wherein the second segment of the lower pad at least partially surrounds a lateral surface of the upper pad, and wherein a level of a top surface of the second segment is higher than a level of an uppermost portion of the connection terminal.

According to an embodiment of the present inventive concept, a semiconductor package includes: a first semiconductor chip; and a second semiconductor chip disposed on the first semiconductor chip, wherein the first semiconductor chip includes: a first semiconductor substrate; and a first pad disposed on a top surface of the first semiconductor substrate, wherein the second semiconductor chip includes: a second semiconductor substrate; a passivation pattern disposed on a first surface of the second semiconductor substrate; a second pad disposed on the passivation pattern; and a connection terminal that covers a lateral surface and a bottom surface of the second pad, wherein the first pad has a U shape from a cross-sectional view, wherein an uppermost portion of the first pad is in contact with the passivation pattern, and wherein an inner lateral surface of the first pad at least partially surrounds the second pad.

According to an embodiment of the present inventive concept, a semiconductor package includes: a package substrate; a chip stack disposed on the package substrate and including a plurality of semiconductor chips; and a molding layer disposed on the package substrate and covering a first surface of the chip stack, wherein the chip stack includes: a first semiconductor chip; and a second semiconductor chip disposed on the first semiconductor chip, wherein the first semiconductor chip includes: a first semiconductor substrate; a through via that penetrates the first semiconductor substrate; and a lower pad disposed on the through via, wherein the lower pad includes: a first segment; and a second segment connected to the first segment, wherein the first segment of the lower pad has a circular shape, wherein the second segment of the lower pad is disposed on an edge region of the first segment and is substantially perpendicular to a top surface of the first segment, wherein the second semiconductor chip includes: a second semiconductor substrate; an upper pad disposed on a bottom surface of the second semiconductor substrate; and a connection terminal disposed between the upper pad and the lower pad, wherein the second segment of the lower pad at least partially surrounds a lateral surface of the upper pad, and wherein a level of a top surface of the second segment is higher than a level of an uppermost portion of the connection terminal.

BRIEF DESCRIPTION OF THE DRAWINGS

FIG. 4A illustrates a plan view showing section B depicted in FIG. 3A.

FIG. 4B illustrates a plan view showing section of B depicted in FIG. 3A.

FIG. 5A illustrates a plan view showing section C of FIG. 3B.

FIG. 5B illustrates a plan view showing section C of FIG. 3B.

FIGS. 6A, 6B, 6C, 6D, 6E and 6F illustrate cross-sectional views showing a method of fabricating the first lower semiconductor chip of FIG. 3A.

FIGS. 7A, 7B, 7C, 7D, 7E and 7F illustrate cross-sectional views showing a method of fabricating the first upper semiconductor chip of FIG. 3B.

DETAILED DESCRIPTION OF EMBODIMENTS

Figure 1:
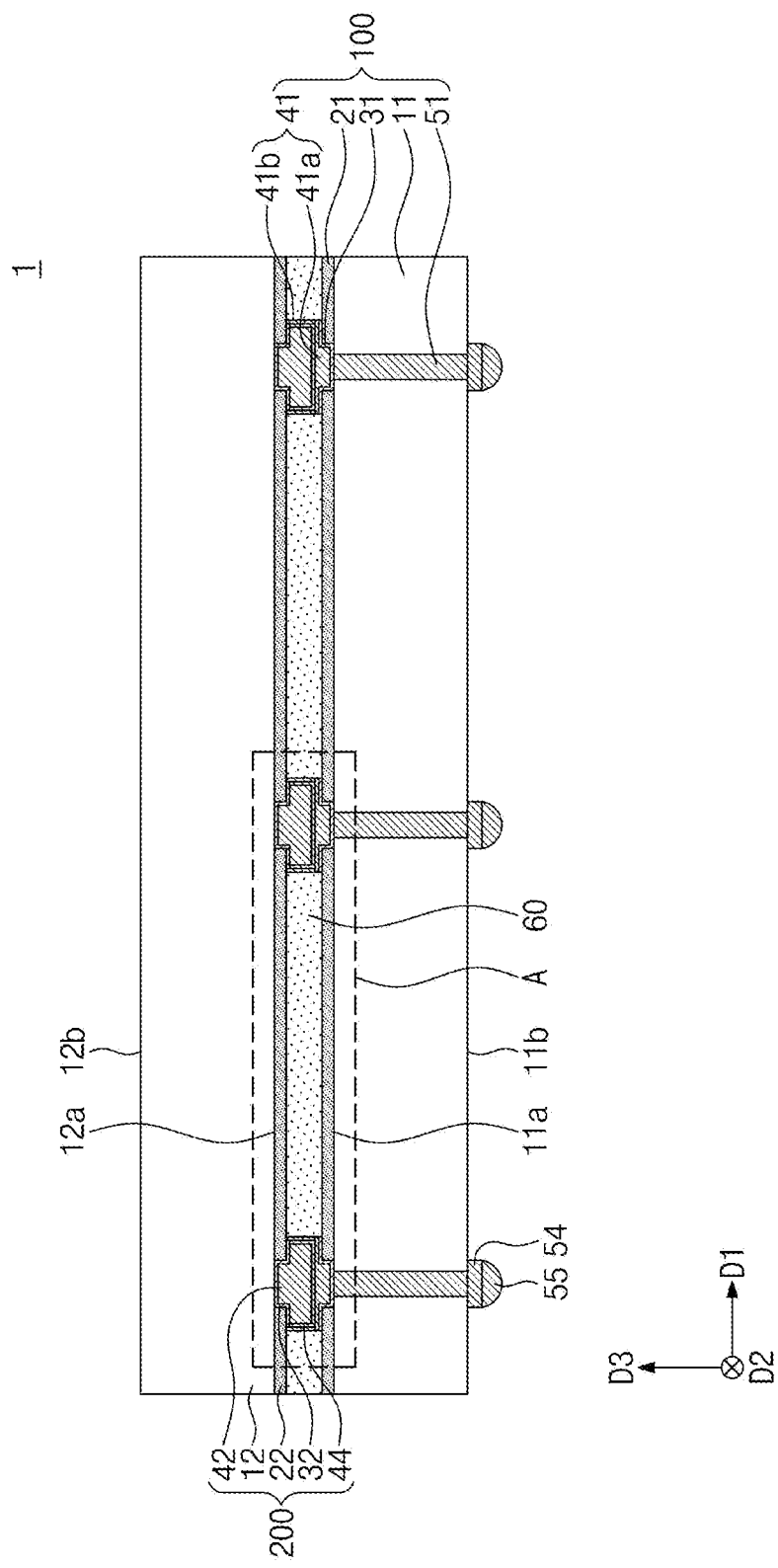
FIG. 1 illustrates a cross-sectional view showing a semiconductor device according to an embodiment of the present inventive concept.
Figure 2:
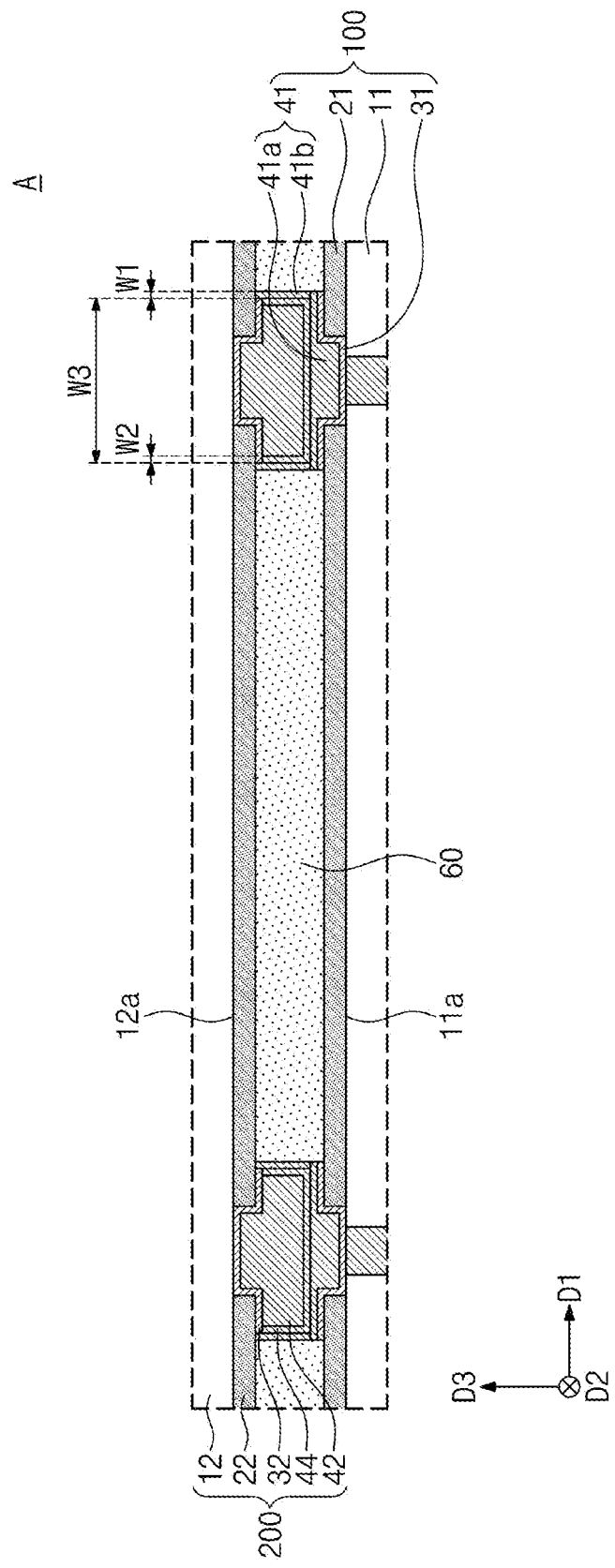
FIG. 2 illustrates an enlarged cross-sectional view showing section A of FIG. 1.

Embodiments of the present inventive concept will now be described more fully with reference to the accompanying drawings FIG. 1 illustrates a cross-sectional view showing a semiconductor device according to an embodiment of the present inventive concept. FIG. 2 illustrates an enlarged cross-sectional view showing section A of FIG. 1.

Referring to FIGS. 1 and 2, a semiconductor package 1 may include a first lower semiconductor chip 100, a first upper semiconductor chip 200 on the first lower semiconductor chip 100, and a first adhesive layer 60 provided between the first lower semiconductor chip 100 and the first upper semiconductor chip 200.

The first lower semiconductor chip 100 may include a first lower semiconductor substrate 11, a first through via 51, a first lower passivation pattern 21, a first lower barrier pattern 31, and a first lower pad 41. The first lower semiconductor chip 100 may be a semiconductor chip including, for example, a memory chip, a logic chip, or a combination thereof.

The first lower semiconductor substrate 11 may have a first surface 11a and a second surface 11b that are opposite to each other. The first lower semiconductor substrate 11 may include a semiconductor material, such as silicon, germanium, or silicon-germanium.

In this description, a first direction D1 may be a direction parallel to the first surface 11a of the first lower semiconductor substrate 11. A second direction D2 may be a direction that is parallel to the first surface 11a of the first lower semiconductor substrate 11 and intersects the first direction D1, and a third direction D3 may be a direction substantially perpendicular to the first lower semiconductor substrate 11.

A plurality of first through vias 51 may penetrate along the third direction D3 through the first lower semiconductor substrate 11. The first through vias 51 may be spaced apart from each other along the first direction D1 and the second direction D2. The first through vias 51 may include, for example, copper. A diffusion stop layer may be additionally provided between the first lower semiconductor substrate 11 and each of the first through vias 51.

The first lower passivation pattern 21 may be disposed on the first surface 11a of the first lower semiconductor substrate 11. The first lower passivation pattern 21 may have a first recession that is recessed toward the first surface 11a. The first surface 11a of the first lower semiconductor substrate 11 may be outwardly exposed on the first recession. A top surface of the first through via 51 may be outwardly exposed on the first recession. The first lower passivation pattern 21 may include a single layer or a plurality of stacked layers. The first lower passivation pattern 21 may include at least one of, for example, silicon oxide, silicon nitride, and/or silicon oxynitride.

The first lower barrier pattern 31 may be provided on the first lower passivation pattern 21 and on a lateral surface of the first lower passivation pattern 21. The first lower barrier pattern 31 may cover a portion of the first surface 11a of the first lower semiconductor substrate 11. For example, the first lower barrier pattern 31 may cover a portion of the first surface 11a that is outwardly exposed on the first recession. The first lower barrier pattern 31 may cover the top surface of the first through via 51, which is outwardly exposed on the first recession. The first lower barrier pattern 31 may partially cover a top surface of the first lower passivation pattern 21 adjacent to the first recession. On the first recession, the first lower barrier pattern 31 may cover the lateral surface of the first lower passivation pattern 21. The first lower barrier pattern 31 may be electrically connected to the first through via 51. The first lower barrier pattern 31 may include, for example, titanium (Ti).

The first lower pad 41 may be provided on the first lower barrier pattern 31. The first lower pad 41 may include a first segment 41a and a second segment 41b. The first segment 41a may be a portion that is adjacent to and covers the first lower barrier pattern 31. For example, the first segment 41a may have a circular or polygonal shape when viewed in plan.

The second segment 41b may be provided on the first segment 41a. For example, the second segment 41b may be provided on a top surface of the first segment 41a. The second segment 41b may be disposed along a corner portion of the first segment 41a and on an edge region of the first segment 41a. The second segment 41b may have an annular shape when viewed in plan. The second segment 41b may outwardly expose a portion of a top surface of the first segment 41a. The first lower pad 41, a combination of the first segment 41a and the second segment 41b, may have a U shape when viewed from a cross-sectional view. For example, the second segment 41b may be substantially perpendicular to the top surface of the first segment 41a, and an empty space may be defined by inner lateral surfaces of the second segment 41b and the top surface of the first segment 41a. The second segment 41b may have a first width W1 in the first direction D1. The first width W1 may range from about 3 μm to about 10 μm. The first segment 41a and the second segment 41b may include, for example, nickel (Ni). In this sense, the first lower pad 41 may include nickel (Ni).

First chip pads 54 may be provided below the first lower semiconductor substrate 11. The first chip pads 54 may vertically overlap the first through vias 51. First chip solders 55 may be provided below the first chip pads 54. The first chip solders 55 may vertically overlap the first chip pads 54. The first chip pads 54 and the first chip solders 55 may include a conductive material.

The first upper semiconductor chip 200 may be provided on the first lower semiconductor chip 100. The first upper semiconductor chip 200 may include a first upper semiconductor substrate 12, first upper passivation pattern 22, a first upper barrier pattern 32, and a first connection terminal 44. The first upper semiconductor chip 200 may be a semiconductor chip including, for example, a memory chip, a logic chip, or a combination thereof.

The first upper semiconductor substrate 12 may have a third surface 12a and a fourth surface 12b that are opposite to each other. The first upper semiconductor substrate 12 may include a semiconductor material, such as silicon, germanium, or silicon-germanium. The third surface 12a of the first upper semiconductor substrate 12 may face the first surface 11a of the first lower semiconductor substrate 11.

The first upper passivation pattern 22 may be provided on the third surface of the first upper semiconductor substrate 12. The first upper passivation pattern 22 may have a second recession that is recessed toward the third surface 12a. The third surface 12a of the first upper semiconductor substrate 12 may be outwardly exposed on the second recession. The first upper passivation pattern 22 may include a single layer or a plurality of stacked layers. The first upper passivation pattern 22 may include at least one of, for example, silicon oxide, silicon nitride, and/or silicon oxynitride.

The first upper barrier pattern 32 may be provided below the first upper passivation pattern 22. The first upper barrier pattern 32 may cover the third surface 12a of the first upper semiconductor substrate 12. For example, the first upper barrier pattern 32 may cover a portion of the third surface 12a that is outwardly exposed on the second recession. The first upper barrier pattern 32 may partially cover a top surface of the first upper passivation pattern 22 adjacent to the second recession. The first upper barrier pattern 32 may include, for example, titanium (Ti).

The first upper pad 42 may be provided below the first upper banter pattern 32. The first upper pad 42 may cover a portion of the first upper barrier pattern 32. The first upper pad 42 may vertically overlap the first lower pad 41. The first upper pad 42 may have a diameter less than a width in the first direction D1 of the first upper barrier pattern 32. A height in the third direction D3 of the first upper pad may range from about 3 µm to about 10 µm. The first upper pad 42 may include, for example, nickel (Ni).

The first connection terminal 44 may be provided between the first lower pad 41 and the first upper pad 42. The first connection terminal 44 may cover bottom and lateral surfaces of the first upper pad 42. The first connection terminal 44 may have a U shape when viewed from a cross-sectional view. The first connection terminal 44 may have an upper surface in contact with the first upper barrier pattern 32. For example, an uppermost surface of the first connection terminal 44 may be in contact with the first upper barrier pattern 32. The first connection terminal 44 may have a second width W2 as a thickness thereof. The second width W2 may range from about 3 µm to about 10 µm. The first connection terminal 44 may include at least one metal, such as tin (Sn), lead (Pb), silver (Ag), zinc (Zn), nickel (Ni), gold (Au), copper (Cu), aluminum (Al), and bismuth (Bi).

A third width W3 may indicate a distance in the first direction D1 between outer lateral surfaces of the first connection terminal 44. The third width W3 may also indicate a distance in the first direction D1 between inner lateral surfaces of the second segment 41b. For example, the distance in the first direction D1 between the outer lateral surfaces of the first connection terminal 44 may be substantially the same as the distance in the first direction D1 between the inner lateral surfaces of the first segment 41a. For this reason, the first connection terminal 44 may be in contact with an inner lateral surface of the second segment 41b.

The first connection terminal 44 may be in contact with a portion of the top surface of the first segment 41a. The second segment 41b may have a top surface whose level is higher than that of the uppermost surface of the of the first connection terminal 44. The first connection terminal 44 may be at least partially surrounded by the first and second segments 41a and 41b of the first lower pad 41.

The first upper pad 42 and the first connection terminal 44 may be electrically connected to each other, and the first connection terminal 44 may be electrically connected to the first lower pad 41. The first lower pad 41 may be electrically connected to the first through via 51. Therefore, the first upper pad 42 and the first through via 51 may be electrically connected to each other.

The first adhesive layer 60 may be provided between the first lower semiconductor chip 100 and the first upper semiconductor chip 200, and may be disposed on lateral surfaces of the first and second lower pads 41 and 42. The first adhesive layer 60 may include a non-conductive film (NCF), such as an Ajinomoto build-up film (ABF).

Figure 3A:
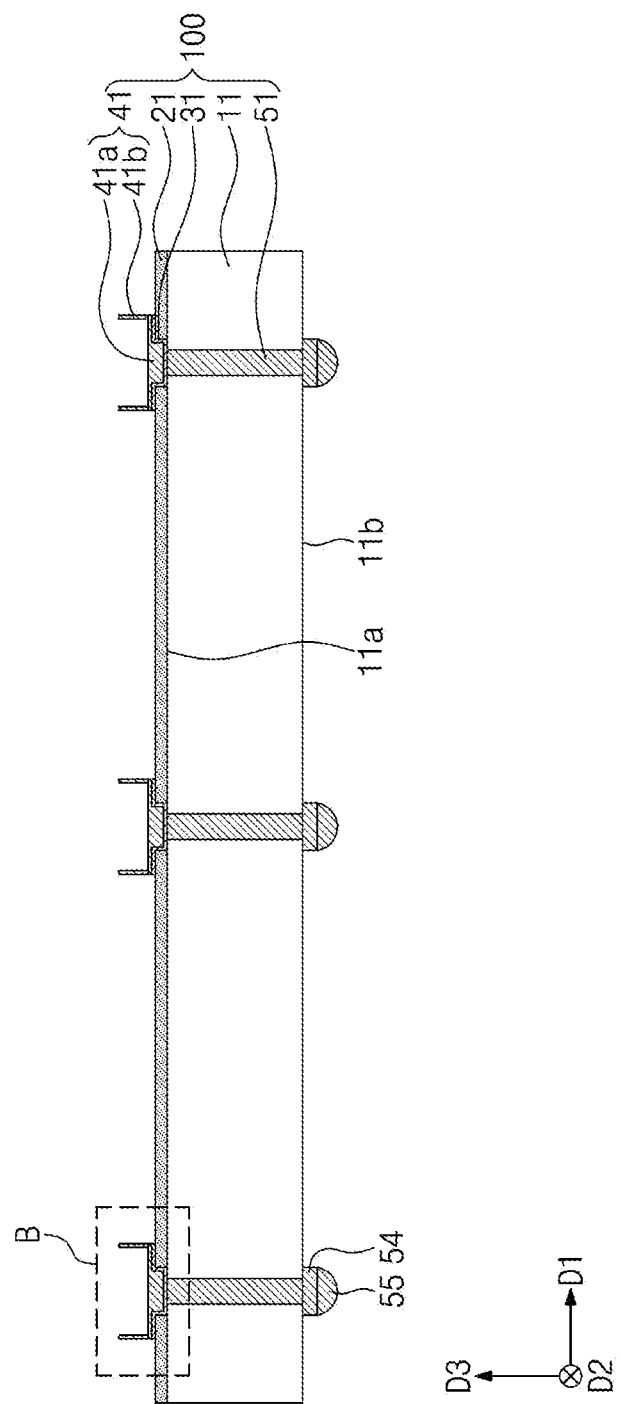
FIG. 3A illustrates a cross-sectional view showing a first lower semiconductor chip of FIG. 1.
Figure 3B:
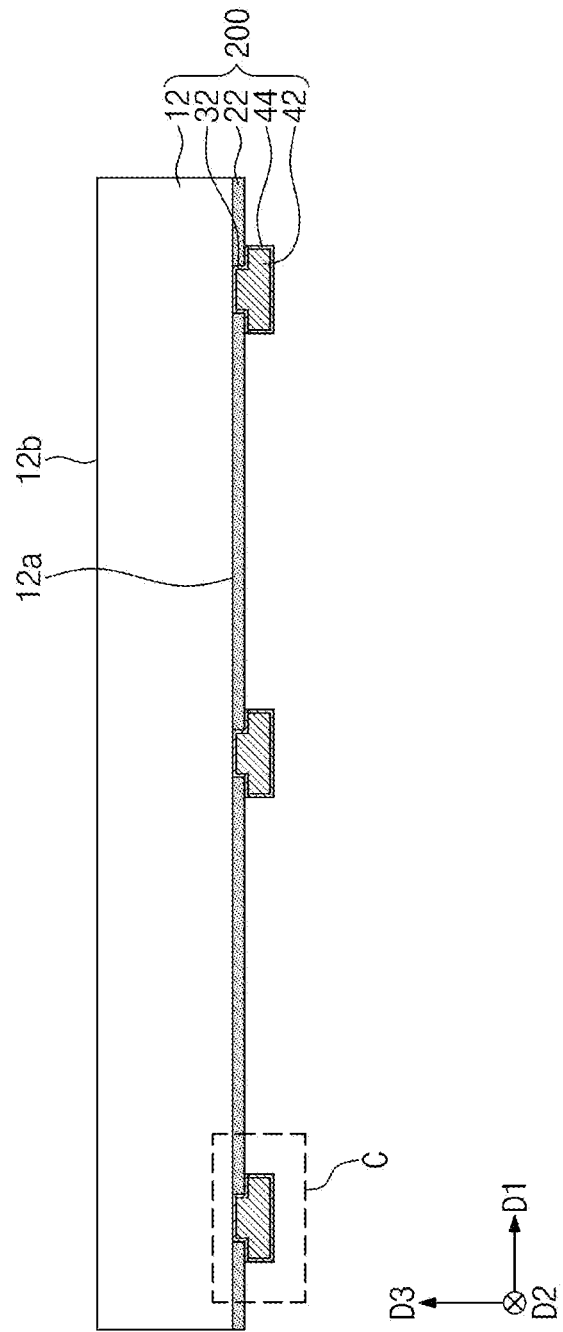
FIG. 3B illustrates a cross-sectional view showing a first upper semiconductor chip of FIG. 1.

FIG. 3A illustrates a cross-sectional view showing a first lower semiconductor chip of FIG. 1. FIG. 3B illustrates a cross-sectional view showing a first upper semiconductor chip of FIG. 1. FIG. 4A illustrates a plan view showing section B depicted in FIG. 3A. FIG. 4B illustrates a plan view showing section of B depicted in FIG. 3A. FIG. 5A illustrates a plan view showing section C of FIG. 3B. FIG. 5B illustrates a plan view showing section C of FIG. 3B.

Referring to FIGS. 3A, 4A, and 4B, the first segment 41a may have a circular or polygonal shape when viewed in plan. The second segment 41b may have an annular or polygonal shape when viewed in plan. The polygonal shape may include, for example, a tetragonal shape.

Referring to FIGS. 2, 4A, and 4B, the second segment 41b may have a first width W1 in the first direction D1. A third width W3 may indicate a distance in the first direction D1 between inner lateral surfaces of the second segment 41b. A top surface of the first segment 41a may have an outwardly exposed portion, and the third width W3 may be substantially the same as a diameter of the outwardly exposed portion of the top surface of the first segment 41a.

Referring to FIGS. 3B, 5A, and 5B, the first upper pad 42 and the first connection terminal 44 may each have a circular or polygonal shape when viewed in plan. The polygonal shape may include, for example, a tetragonal shape. When viewed in plan, the first connection terminal 44 may have a third width W3 as a diameter thereof. The third width W3 may be substantially the same as a distance in the first direction D1 between inner lateral surfaces of the second segment 41b.

FIGS. 6A to 6F illustrate cross-sectional views showing a method of fabricating the first lower semiconductor chip 100 of FIG. 3A.

Figure 6A:
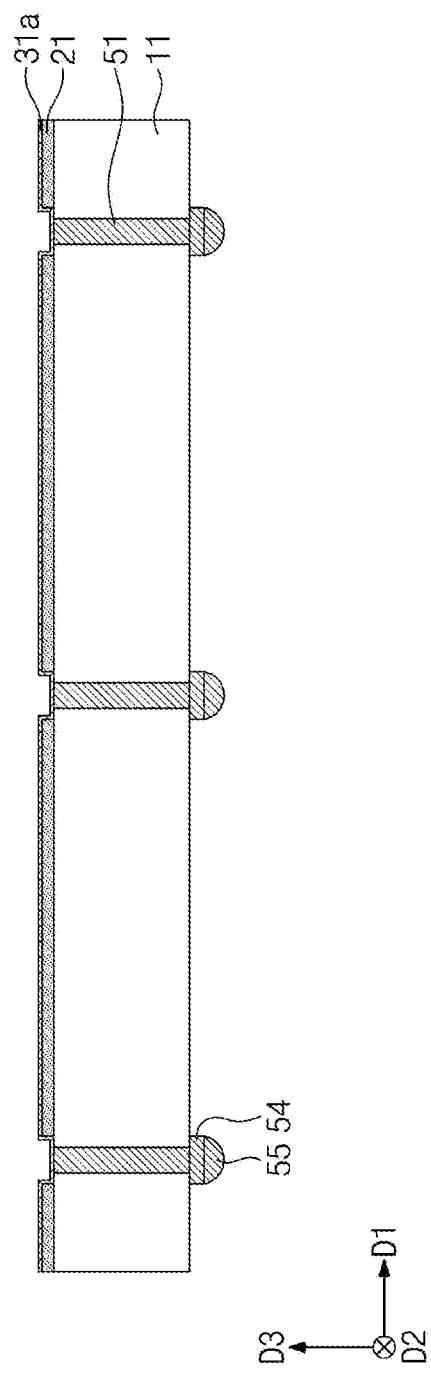

Referring to FIG. 6A, a first lower semiconductor substrate 11 may be provided. First through vias 51 may be provided in the first lower semiconductor substrate 11. First chip pads 54 may be provided below and on the first through vias 51. First chip solders 55 may be provided below and on the first chip pads 54.

A first lower passivation pattern 21 may be formed on the first lower semiconductor substrate 11. The first lower passivation pattern 21 may have a first recession that is recessed toward a top surface of the first lower semiconductor substrate 11. The first through vias 51 may have top surfaces that are outwardly exposed on the first recession. The first lower passivation pattern 21 may be formed by chemical vapor deposition (CVD) or atomic layer deposition (ALD).

A first barrier layer 31a may be formed on the first lower passivation pattern 21. For example, the first barrier layer 31a may cover top and lateral surfaces of the first lower passivation pattern 21, and may also cover an outwardly exposed top surface of the first lower semiconductor substrate 11. The first barrier layer 31a may be formed by an electroplating method. The first barrier layer 31a may include, for example, titanium (Ti).

Figure 6B:
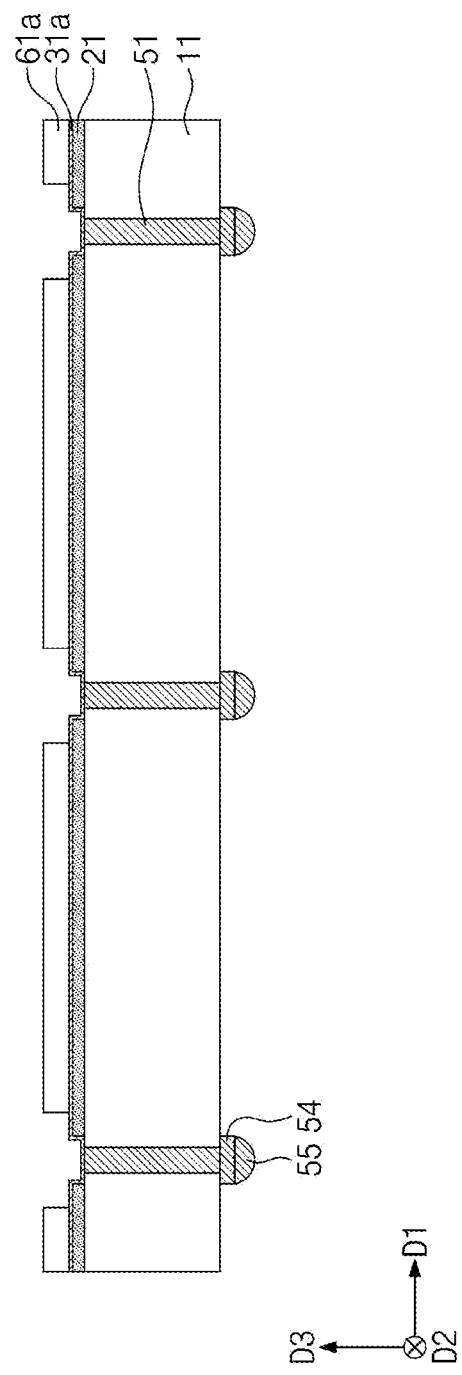

Referring to FIG. 6B, a first photoresist pattern 61a may be formed on the first barrier layer 31a. The first photoresist pattern 61a may expose the first recession of the first lower passivation pattern 21, and may partially expose a top surface of the first barrier layer 31a adjacent to the first recession. The first photoresist pattern 61a may include a photoresist (PR) material.

Referring to FIG. 6C, a first segment 41a may be formed on a location exposed by the first photoresist pattern 61a. The first segment 41a may cover a portion of the first barrier layer 31a on the first recession and on a region adjacent to the first recession. After the first segment 41a is formed, the first photoresist pattern 61a may be removed.

Referring to FIG. 6D, a second photoresist pattern 61b may be formed on the first barrier layer 31a and the first segment 41a. The second photoresist pattern 61b may include an opening that exposes an edge region of the first segment 41a along a portion of the first segment 41a, for example, along a corner portion of the first segment 41a. The opening in the second photoresist pattern 61b may be located where the second segment 41b of FIG. 1 will be formed. The second photoresist pattern 61b may include a photoresist (PR) material.

Figure 6E:
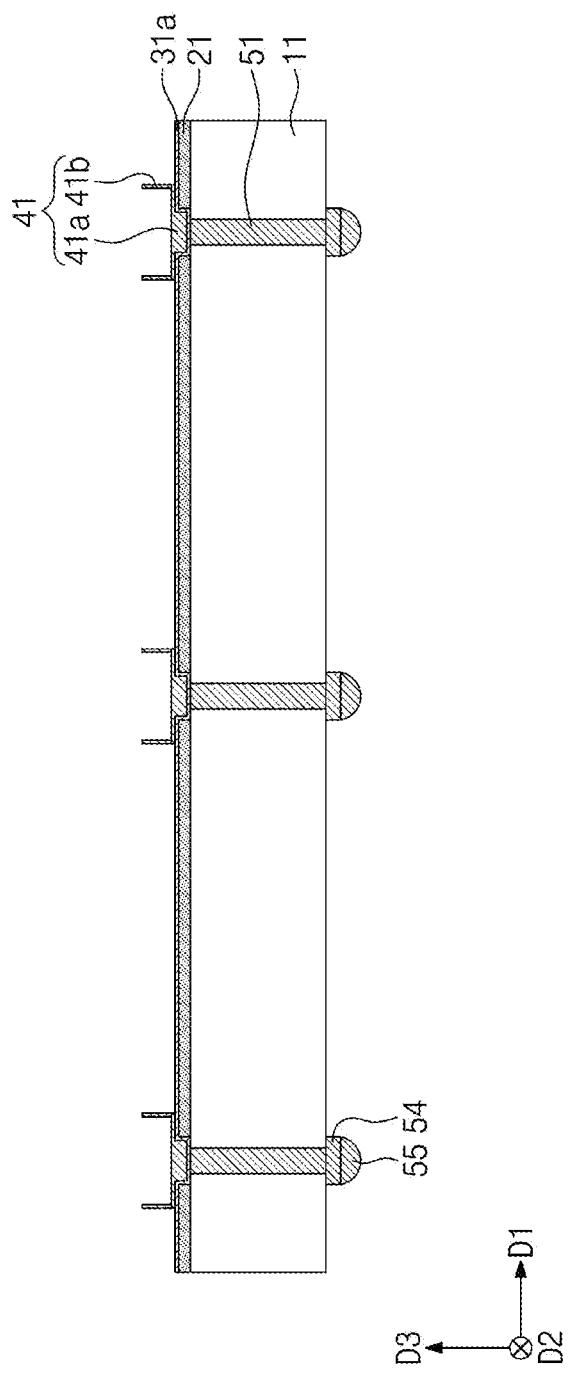

Referring to FIG. 6E, a second segment 41b may be formed on the first segment 41a. Therefore, the first segment 41a and the second segment 41b may be combined to form a first lower pad 41. Afterwards, the second photoresist pattern 61b may be removed.

Figure 6F:
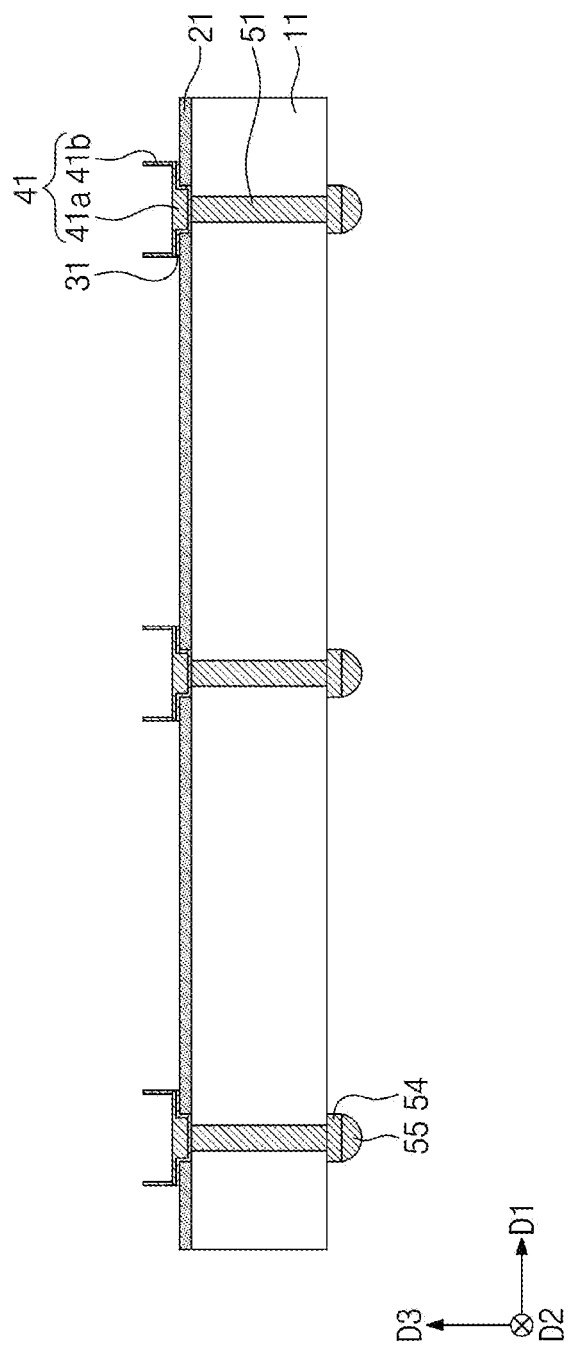

Referring to FIG. 6F, a first lower barrier pattern 31 may be formed by partially etching the first barrier layer 31a whose top surface is exposed. The first lower barrier pattern 31 may have a top surface that is not outwardly exposed. Accordingly, a first lower semiconductor chip 100 may be fabricated.

FIGS. 7A to 7F illustrate cross-sectional views showing a method of fabricating the first upper semiconductor chip 200 of FIG. 3B.

Referring to FIG. 7A, a first upper semiconductor substrate 12 may be provided. A first upper passivation pattern 22 may be formed on the first upper semiconductor substrate 12. The first upper passivation pattern 22 may have a second recession that is recessed toward a top surface of the first upper semiconductor substrate 12. The first upper passivation pattern 22 may be formed by chemical vapor deposition (CND) or atomic layer deposition (ALD).

A second barrier layer 32a may be formed on the first upper passivation pattern 22. The second barrier layer 32a may cover top and lateral surfaces of the first upper passivation pattern 22, and may also cover an outwardly exposed top surface of the first upper semiconductor substrate 12. The second barrier layer 32a may be formed by an electroplating method. The second barrier layer 32a may include titanium (Ti).

Referring to FIG. 7B, a third photoresist pattern 62a may be formed on the second barrier layer 32a. The third photoresist pattern 62a may expose the second recession of the first upper passivation pattern 22 and may partially expose a top surface of the second barrier layer 32a adjacent to the second recession. The third photoresist pattern 62a may expose a location where the first upper pad 42 of FIG. 1 will be formed. The third photoresist pattern 62a may include a photoresist (PR) material.

Referring to FIG. 7C, a first upper pad 42 may be formed on a location exposed by the third photoresist pattern 62a. The first upper pad 42 may cover the top surface of the second barrier layer 32a on the second recession of first upper passivation pattern 22 and on a region adjacent to the second recession. A thin solder layer 44a may be formed on the first upper pad 42. The thin solder layer 44a may cover a top surface of the first upper pad 42. The thin solder layer 44a may include at least one of tin (Sn), lead (Pb), silver (Ag), zinc (Zn), gold (Au), copper (Cu), aluminum (Al), and/or bismuth (Bi). Afterwards, the third photoresist pattern 62a may be removed.

Referring to FIG. 7D, a fourth photoresist pattern 62b may be formed on the second barrier layer 32a. The fourth photoresist pattern 62b may expose a location on which will be formed a lateral surface section of the first connection terminal 44 depicted in FIG. 1. For example, the lateral surface section of the first connection terminal 44 may be formed in a gap between the first upper pad 42 and the fourth photoresist pattern 62b, and the gap may expose a portion of the second barrier layer 32a. As an additional example, the lateral surface section of the first connection terminal 44 may be formed in a gap between the thin solder layer 44a and the fourth photoresist pattern 62b. The fourth photoresist pattern 62b may include a photoresist (PR) material.

Referring to FIG. 7E, a plating method may be used such that a location exposed by the fourth photoresist pattern 62b may be filled with a material the same as that of the thin solder layer 44a, and thus, the filling material and the thin solder layer 44a may be combined to form a first connection terminal 44.

Referring to FIG. 7F, a first upper barrier pattern 32 may be formed by etching a portion of the second barrier layer 32a that is exposed. For example, exposed portions of the top surface of the second barrier layer 32a may be etched. The first upper barrier pattern 32 may have a top surface that is not outwardly exposed. Accordingly, a first upper semiconductor chip 200 may be fabricated.

Figure 8:
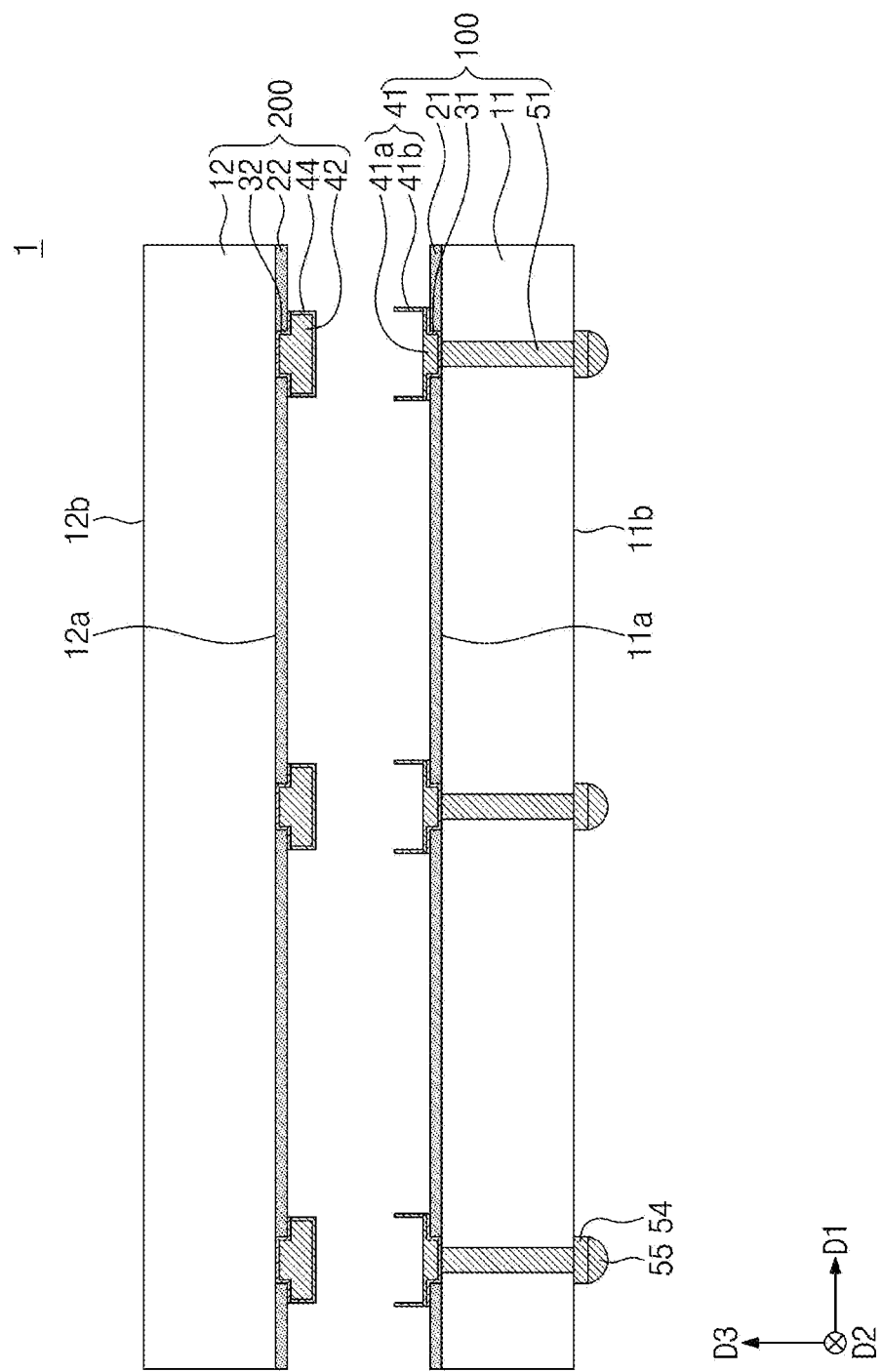
FIG. 8 illustrates a cross-sectional view showing a method of fabricating a semiconductor package according to an embodiment of the present inventive concept.

FIG. 8 illustrates a cross-sectional view showing a method of fabricating a semiconductor package according to an embodiment of the present inventive concept.

Referring to FIG. 8, the first upper semiconductor chip 200 may vertically overlap the first lower semiconductor chip 100, such that the first lower pad 41 and the first upper pad 42 may vertically overlap each other. After that, the first lower semiconductor chip 100 and the first upper semiconductor chip 200 may approach each other so that the first lower pad 41 and the first connection terminal 44 may come into contact each other. After the first lower pad 41 and the first connection terminal 44 come into contact each other, a first adhesive layer 60 may be provided to attach the first lower semiconductor chip 100 and the first upper semiconductor chip 200 to each other. Accordingly, a semiconductor package 1 may be eventually fabricated.

Figure 9:
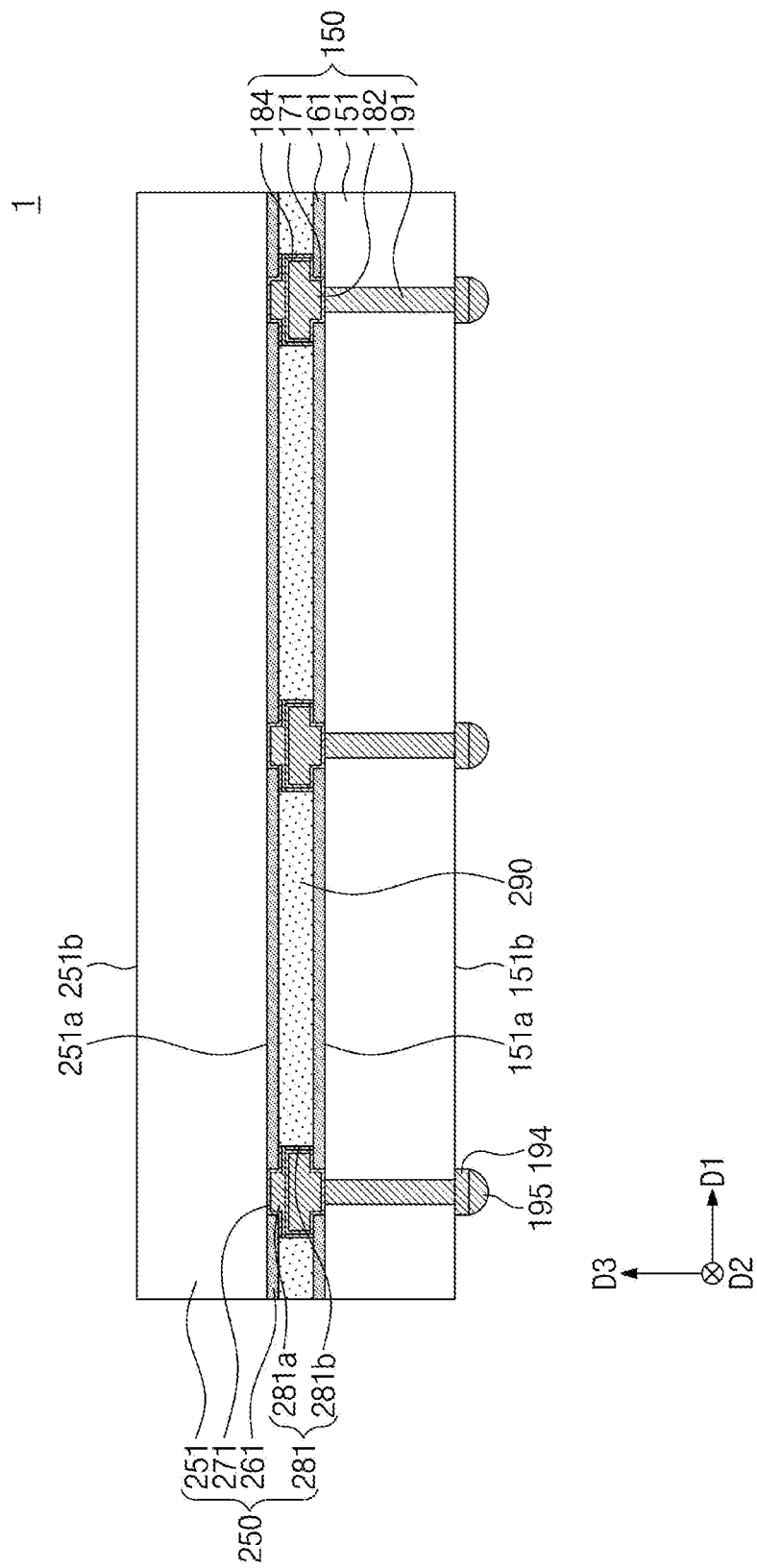
FIG. 9 illustrates a cross-sectional view showing a semiconductor package according to an embodiment of the present inventive concept.

FIG. 9 illustrates a cross-sectional view showing a semiconductor package according to an embodiment of the present inventive concept.

Referring to FIG. 9, a semiconductor package 1 may include a second lower semiconductor chip 150, a second upper semiconductor chip 250 on the second lower semiconductor chip 150, and a second adhesive layer 290 between the second lower semiconductor chip 150 and the second upper semiconductor chip 250.

The second lower semiconductor chip 150 may include a second lower semiconductor substrate 151, a second lower passivation pattern 161, a second lower barrier pattern 171, a second lower pad 182, a second connection terminal 184, and a second through via 191. The second lower semiconductor substrate 151 may have a fifth surface 151a and a sixth surface 151b that are opposite to each other. The second lower semiconductor substrate 151 may be provided with second chip pads 194 on the sixth surface 151b, and second chip solders 195 may be provided below and on the second chip pads 194.

The second lower semiconductor substrate 151, the second lower passivation pattern 161, the second lower barrier pattern 171, the second lower pad 182, the second connection terminal 184, and the second through via 191 may substantially and respectively correspond to the first upper semiconductor substrate 12, the first upper passivation pattern 22, the first upper barrier pattern 32, the first upper pad 42, the first connection terminal 44, and the first through via 51 that are depicted in FIG. 1. The second chip pads 194 and the second chip solders 195 may substantially correspond to the first chip pads 54 and the first chip solders 55 that are depicted in FIG. 1.

Among explanations of components included in the second lower semiconductor chip 150, the second chip pads 194, and the second chip solders 195, a repetitive description of components of FIG. 1 will be omitted hereinafter.

The second upper semiconductor chip 250 may include a second upper semiconductor substrate 251, a second upper passivation pattern 261, a second upper barrier pattern 271, and a second upper pad 281.

The second upper pad 281 may include a third segment 281a and a fourth segment 281b. The second upper semiconductor substrate 251, the second upper passivation pattern 261, the second upper barrier pattern 271, the second upper pad 281, the third segment 281a, and the fourth segment 281b may substantially and respectively correspond to the first lower semiconductor substrate 11, the first lower passivation pattern 21, the first lower barrier pattern 31, the first lower pad 41, the first segment 41a, and the second segment 41b that are depicted in FIG. 1.

Among explanations of components included in the second upper semiconductor chip 250, a repetitive description of components of FIG. 1 will be omitted hereinafter.

The second adhesive layer 290 may substantially correspond to the first adhesive layer 60 of FIG. 1. Among explanations of components included in the second adhesive layer 290, a repetitive description of the first adhesive layer 60 of FIG. 1 will be omitted hereinafter FIG. 10 illustrates a cross-sectional view showing a semiconductor package according to an embodiment of the present inventive concept.

Figure 10:
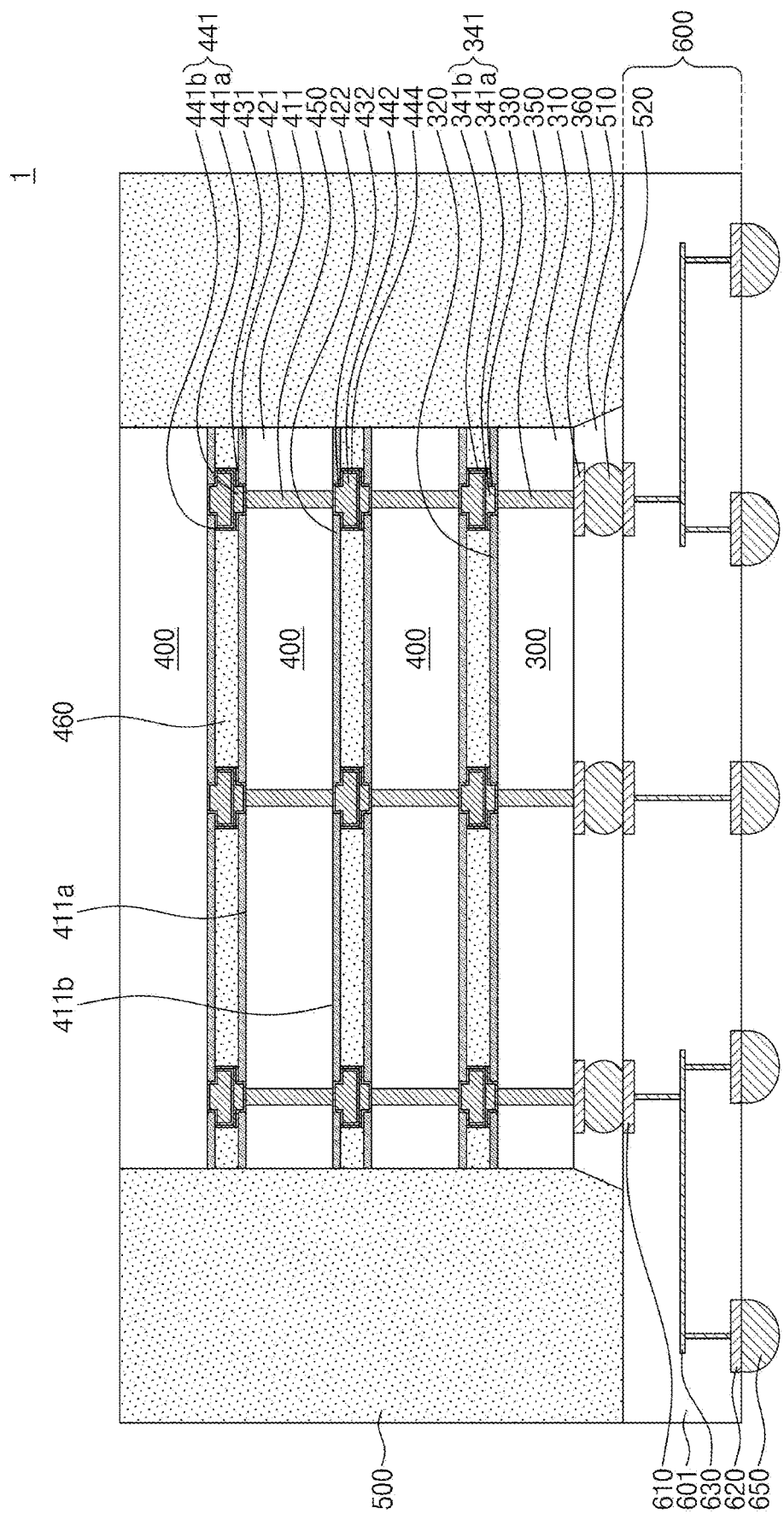
FIG. 10 illustrates a cross-sectional view showing a semiconductor package according to an embodiment of the present inventive concept.

Referring to FIG. 10, a semiconductor package 1 may include a package substrate 600, a chip stack, and a molding layer 500.

The package substrate 600 may include a dielectric base layer 601, package substrate pads 610, terminal pads 620, and package substrate lines 630. For example, the package substrate 600 may be a printed circuit board (PCB). The dielectric base layer 601 may include a single layer or a plurality of stacked layers. The package substrate pads 610 may be adjacent to a top surface of the package substrate 600, and the terminal pads 620 may be adjacent to a bottom surface of the package substrate 600. The package substrate pads 610 may be exposed at the top surface of the package substrate 600.

The package substrate lines 630 may be disposed in the dielectric base layer 601, and may be electrically connected to the package substrate pads 610 and the terminal pads 620. The package substrate pads 610, the terminal pads 620, and the package substrate lines 630 may include a conductive metallic material. For example, each of the package substrate pads 610, the terminal pads 620, and the package substrate lines 630 may include at least one of copper (Cu), aluminum (Al), tungsten (W), and/or titanium (Ti).

External terminals 650 may be provided on the bottom surface of the package substrate 600. The external terminals 650 may be disposed on bottom surfaces of the terminal pads 620. The external terminals 650 may be electrically connected to the package substrate lines 630. The external terminals 650 may be coupled to an external device or a host device. Therefore, external electrical signals may be transmitted through the external terminals 650 to or from the package substrate pads 610.

The external terminals 650 may include solder balls or solder bumps. The external terminals 650 may include a conductive metallic material. For example, the external terminals 650 may include at least one of tin (Sn), lead (Pb), silver (Ag), zinc (Zn), nickel (Ni), gold (Au), copper (Cu), aluminum (Al), and/or bismuth (Bi).

The chip stack may be provided on the package substrate 600. The chip stack may include a plurality of semiconductor chips. The chip stack may include a first chip stack semiconductor chip 300 and second chip stack semiconductor chips 400.

The first chip stack semiconductor chip 300 may be provided on the package substrate 600. The first chip stack semiconductor chip 300 may include a first chip stack semiconductor substrate 310, external pads 360, first chip stack through vias 350, a first chip stack passivation pattern 320, a first chip stack harrier pattern 330, and a first chip stack lower pad 341. The first chip stack semiconductor chip 300 may include a logic chip, a buffer chip, or a system-on-chip (SOC). For example, the first chip stack semiconductor chip 300 may be an application specific integrated circuit (ASIC) chip or an application processor (AP) chip. The ASIC chip may include an application specific integrated circuit (ASIC). The first chip stack semiconductor chip 300 may include a central processing unit (CPU) or a graphic processing unit (GPU).

The external pads 360 may be disposed adjacent to a bottom surface of the first chip stack semiconductor chip 300. The external pads 360 may correspond to the first chip pads 54 of FIG. 1. The external pads 360 may vertically overlap corresponding ones of the package substrate pads 610 included in the package substrate 600.

The first chip stack through vias 350 may vertically penetrate the first chip stack semiconductor substrate 310, while vertically overlapping the external pads 360. The first chip stack through vias 350 may correspond to the first through vias 51 of FIG. 1. The first chip stack through vias 350 may include, for example, copper (Cu).

The first chip stack passivation pattern 320 may be provided on the first chip stack semiconductor substrate 310. The first chip stack passivation pattern 320 may correspond to the first lower passivation pattern 21 of FIG. 1. The first chip stack passivation pattern 320 may be substantially the same as the first lower passivation pattern 21 discussed with reference to FIGS. 1 and 2.

The first chip stack barrier pattern 330 may cover a portion of a top surface of the first chip stack passivation pattern 320, a lateral surface of the first chip stack passivation pattern 320, and a third recession. The first chip stack barrier pattern 330 may be substantially the same as the first lower barrier pattern 31 discussed with reference to FIGS. 1 and 2. The third recession may be substantially the same as the first recession discussed with reference to FIGS. 1 and 2.

The first chip stack lower pad 341 may be provided on and cover the first chip stack barrier pattern 330. The first chip stack lower pad 341 may be substantially the same as the first lower pad 41 discussed with reference to FIGS. 1 and 2.

A substrate under-fill layer 510 may be interposed between the package substrate 600 and the first chip stack semiconductor chip 300. The substrate under-fill layer 510 may include a nonconductive film (NCF), such as an Ajinomoto build-up film (ABF). A package solder 520 may be included in the substrate under-fill layer 510. The package solder 520 may be disposed between and may vertically overlap the package substrate pad 610 and its corresponding external pad 360. The package substrate pad 610 and the external pad 360 may be electrically connected to each other through the package solder 520. The package solder 520 may include a conductive material, and may have at least one of, for example, solder-ball shapes, bump shapes, and pillar shapes.

The second chip stack semiconductor chips 400 may be provided on the first chip stack semiconductor chip 300. The second chip stack semiconductor chips 400 may be of a different type from the first chip stack semiconductor chip 300. For example, the second chip stack semiconductor chips 400 may be memory chips. The memory chips may include, for example, high bandwidth memory (HBM) chips. Differently from that shown in FIG. 10, there may be a large variation in the number of the chip stack, the first chip stack, the first chip stack semiconductor chip 300, and the second chip stack semiconductor chips 400.

Each of the second chip stack semiconductor chips 400 may include a second chip stack semiconductor substrate 411, a second chip stack lower passivation pattern 421, a second chip stack lower barrier pattern 431, a second chip stack lower pad 441, a second chip stack upper passivation pattern 422, a second chip stack upper barrier pattern 432, a second chip stack upper pad 442, and a chip connection terminal 444.

The second chip stack semiconductor substrate 411, the second chip stack lower passivation pattern 421, the second chip stack lower barrier pattern 431, the second chip stack lower pad 441, the second chip stack upper passivation pattern 422, the second chip stack upper barrier pattern 432, the second chip stack upper pad 442, and the chip connection terminal 444 may be substantially and respectively the same as the first lower semiconductor substrate 11, the first lower passivation pattern 21, the first lower barrier pattern 31, the first lower pad 41, the first upper passivation pattern 22, the first upper barrier pattern 32, the first upper pad 42, and the first connection terminal 44 that are discussed with reference to FIGS. 1 and 2.

Each of the second chip stack semiconductor chips 400 may include second chip stack through vias 450. The second chip stack through vias 450 may be substantially the same as the first through vias 51 and the second through vias 191 discussed with reference to FIGS. 1 and 9.

Differently from that discussed with reference to FIGS. 1 and 2, the second chip stack semiconductor chips 400 may each include the second chip stack lower pad 441 on one surface of the second chip stack semiconductor substrate 411 and simultaneously include the second chip stack upper pad 442 on another surface (e.g., an opposing surface) of the second chip stack semiconductor substrate 411. The second chip stack lower pad 441 and the second chip stack upper pad 442 may be electrically connected to each other through the second chip stack through via 450.

A chip adhesive layer 460 may be provided between the first chip stack semiconductor chip 300 and a lowermost second chip stack semiconductor chip 400 and between the second chip stack semiconductor chips 400. The chip adhesive layer 460 may be substantially the same as the first adhesive layer 60 discussed with reference to FIGS. 1 and 2.

The molding layer 500 may be provided on the package substrate 600. The molding layer 500 may cover the top surface of the package substrate 600, a sidewall of the first chip stack semiconductor chip 300, and sidewalls of the second chip stack semiconductor chips 400. In an embodiment of the present inventive concept, the molding layer 500 may expose a top surface of an uppermost second chip stack semiconductor chip 400. The molding layer 500 may include a dielectric polymer, such as an epoxy molding compound (EMC).

A semiconductor package according to an embodiment of the present inventive concept may be configured such that a first pad (e.g., a lower pad) is inserted into an empty space of a second pad (e.g., an upper pad), and may thus decrease in thickness.

Moreover, even when warpage occurs after formation of a package structure, a closely adhered structure between the first and second pads may prevent non-wet failure in which no connection terminal is in contact with the first pad or the second pad. Accordingly, the semiconductor package may increase in reliability.

While the present inventive concept has been particularly shown and described with reference to example embodiments thereof, it will be apparent to those of ordinary skill in the art that various changes in form and detail may be made thereto without departing from the spirit and scope of the present inventive concept.

What is claimed is:

1. A semiconductor package, comprising:
a first semiconductor chip; and
a second semiconductor chip disposed on the first semiconductor chip,
wherein the first semiconductor chip includes:
a first semiconductor substrate;
a through via that penetrates the first semiconductor substrate; and
a lower pad disposed on the through via,
wherein the lower pad includes:
a first segment; and
a second segment connected to the first segment,
wherein the first segment of the lower pad vertically overlaps the through via,
wherein the second segment of the lower pad is disposed on an edge region of the first segment, wherein the second segment has an annular shape,
wherein the second semiconductor chip includes:
a second semiconductor substrate;
an upper pad disposed on a bottom surface of the second semiconductor substrate; and
a connection terminal disposed between the upper pad and the lower pad,
wherein the second segment of the lower pad at least partially surrounds a lateral surface of the upper pad, and
wherein a level of a top surface of the second segment is higher than a level of an uppermost portion of the connection terminal.

2. The semiconductor package of claim 1, wherein the connection terminal covers the lateral surface and a bottom surface of the upper pad.

3. The semiconductor package of claim 1, wherein the connection terminal is disposed on a top surface of the first segment of the lower pad and an inner lateral surface of the second segment.

4. The semiconductor package of claim 1, wherein
the second segment of the lower pad has a first width in a first direction parallel to a top surface of the first semiconductor substrate,
the connection terminal has a U shape from a cross-sectional view, and
the first width and a thickness of the connection terminal are in a range of about 3 µm to about 10 µm.

5. The semiconductor package of claim 1, further comprising a barrier pattern disposed between the upper pad and the second semiconductor substrate,
wherein a width in a first direction of the barrier pattern is less than a diameter of the lower pad, the first direction being parallel to a top surface of the lower pad.

6. The semiconductor package of claim 5, wherein the connection terminal is in contact with the barrier pattern.

7. The semiconductor package of claim 6, wherein
the barrier pattern includes titanium, and
the upper pad includes nickel.

8. The semiconductor package of claim 1, wherein the first segment and the second segment include the same metallic material.

9. The semiconductor package of claim 1, further comprising an adhesive layer disposed between the first semiconductor substrate and the second semiconductor substrate, wherein the adhesive layer is disposed on a lateral surface of the lower pad and the lateral surface of the upper pad.

10. The semiconductor package of claim 1, wherein a height of the upper pad is in a range of about 3 μm to about 10 μm.

11. The semiconductor package of claim 1, wherein
the upper pad and the first segment of the lower pad have a circular shape, and
a diameter of the first segment of the lower pad is greater than a diameter of the upper pad.

12. A semiconductor package, comprising:
a first semiconductor chip; and
a second semiconductor chip disposed on the first semiconductor chip,
wherein the first semiconductor chip includes:
a first semiconductor substrate; and
a first pad disposed on a top surface of the first semiconductor substrate,
wherein the second semiconductor chip includes:
a second semiconductor substrate;
a passivation pattern disposed on a first surface of the second semiconductor substrate;
a second pad disposed on the passivation pattern; and
a connection terminal that covers a lateral surface and a bottom surface of the second pad,
wherein the first pad has a U shape from a cross-sectional view,
wherein an uppermost portion of the first pad is in contact with the passivation pattern, and
wherein an inner lateral surface of the first pad at least partially surrounds the second pad.

13. The semiconductor package of claim 12, wherein
the first pad covers the connection terminal, and
a thickness of the connection terminal is in a range of about 3 μm to about 10 μm.

14. The semiconductor package of claim 12, further comprising a through via disposed below the first pad and penetrating the first semiconductor substrate.

15. The semiconductor package of claim 12, further comprising a barrier pattern disposed between the second pad and the second semiconductor substrate,
wherein a first width in a first direction of the barrier pattern is greater than a diameter of the second pad,
wherein the first direction is parallel to the first surface of the second semiconductor substrate.

16. The semiconductor package of claim 15, wherein
the barrier pattern includes titanium, and
the first pad and the second pad include nickel.

17. The semiconductor package of claim 15, wherein the connection terminal is in contact with the barrier pattern.

18. The semiconductor package of claim 12, the connection terminal is in contact with the inner lateral surface of the first pad.

19. The semiconductor package of claim 12, further comprising an adhesive layer disposed between the first semiconductor substrate and the second semiconductor substrate,
wherein the adhesive layer is spaced apart from the second pad.

20. A semiconductor package, comprising:
a package substrate;
a chip stack disposed on the package substrate and including a plurality of semiconductor chips; and
a molding layer disposed on the package substrate and covering a first surface of the chip stack,
wherein the chip stack includes:
a first semiconductor chip; and
a second semiconductor chip disposed on the first semiconductor chip,
wherein the first semiconductor chip includes:
a first semiconductor substrate;
a through via that penetrates the first semiconductor substrate; and
a lower pad disposed on the through via,
wherein the lower pad includes:
a first segment; and
a second segment connected to the first segment,
wherein the first segment of the lower pad has a circular shape,
wherein the second segment of the lower pad is disposed on an edge region of the first segment and is substantially perpendicular to a top surface of the first segment,
wherein the second semiconductor chip includes:
a second semiconductor substrate;
an upper pad disposed on a bottom surface of the second semiconductor substrate; and
a connection terminal disposed between the upper pad and the lower pad,
wherein the second segment of the lower pad at least partially surrounds a lateral surface of the upper pad, and
wherein a level of a top surface of the second segment is higher than a level of an uppermost portion of the connection terminal.

* * * * *